(12) United States Patent
Li

(10) Patent No.: US 12,238,922 B2
(45) Date of Patent: Feb. 25, 2025

(54) SEMICONDUCTOR DEVICE AND METHOD OF FORMING THE SAME

(71) Applicant: Winbond Electronics Corp., Taichung (TW)

(72) Inventor: Chun-Lin Li, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 455 days.

(21) Appl. No.: 17/709,875

(22) Filed: Mar. 31, 2022

(65) Prior Publication Data

US 2023/0024465 A1 Jan. 26, 2023

(30) Foreign Application Priority Data

Jul. 26, 2021 (TW) ................................ 110127370

(51) Int. Cl.
*H10B 12/00* (2023.01)
*H01L 21/283* (2006.01)

(52) U.S. Cl.
CPC ........... *H10B 12/36* (2023.02); *H10B 12/053* (2023.02); *H10B 12/315* (2023.02); *H01L 21/283* (2013.01)

(58) Field of Classification Search
CPC .... H10B 12/36; H10B 12/053; H10B 12/315; H10B 12/283; H10B 12/0335; H10B 12/31; H10B 12/34
See application file for complete search history.

(56) References Cited

U.S. PATENT DOCUMENTS

| 8,896,059 | B1* | 11/2014 | Kim | .................... H01L 29/4236 |
| | | | | 257/331 |
| 9,129,945 | B2 | 9/2015 | Lee et al. | |
| 2010/0148233 | A1* | 6/2010 | Fujimoto | ............. H10B 12/053 |
| | | | | 257/296 |
| 2011/0143508 | A1* | 6/2011 | Kim | ....................... H10B 12/34 |
| | | | | 438/270 |
| 2013/0320409 | A1* | 12/2013 | Scheiper | ........... H01L 29/66803 |
| | | | | 257/E21.409 |
| 2017/0084615 | A1* | 3/2017 | Lee | ......................... H10B 12/34 |
| 2020/0161306 | A1* | 5/2020 | Seo | ........................ H10B 12/34 |
| 2020/0381436 | A1* | 12/2020 | Noh | .................. H01L 21/31155 |

FOREIGN PATENT DOCUMENTS

| TW | 201834031 A | 9/2018 |
| TW | 202119619 A | 5/2021 |

* cited by examiner

*Primary Examiner* — Fernando L Toledo
*Assistant Examiner* — Marshall Mu-Nuo Hatfield
(74) *Attorney, Agent, or Firm* — Muncy, Geissler, Olds & Lowe, P.C.

(57) ABSTRACT

A semiconductor device includes a substrate, a pair of source/drain regions, a metal-containing layer, and a gate structure. The substrate includes a trench. The source/drain regions are disposed in the substrate on opposite sides of the trench. The metal-containing layer is disposed under the trench, wherein the metal-containing layer includes a metal silicide layer, and the metal-containing layer and the substrate on opposite sidewalls of the trench collectively form the channel region of the semiconductor device. The gate structure is disposed in the trench. The gate structure includes a gate dielectric layer disposed on opposite sidewalls of the trench, a buffer layer disposed on the metal-containing layer, and a gate conductive layer disposed on the buffer layer and filling in the trench.

11 Claims, 8 Drawing Sheets

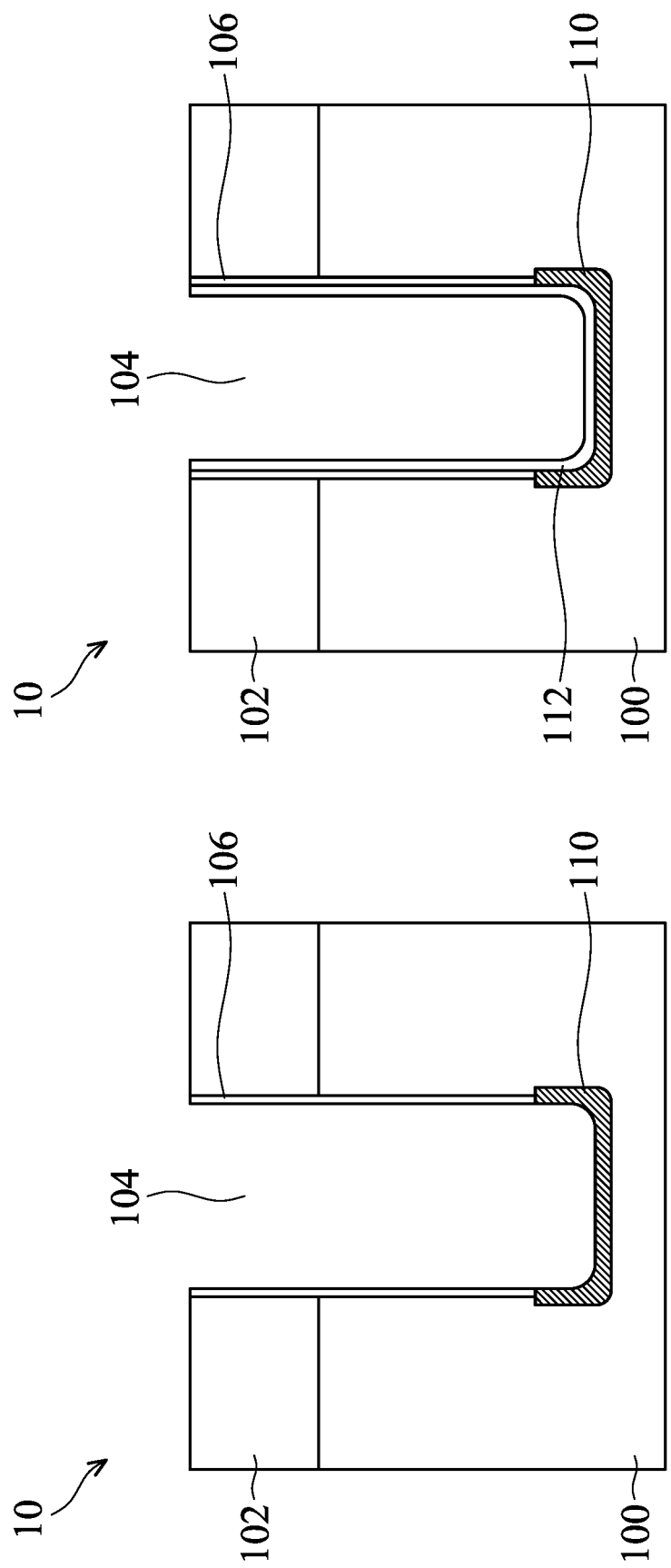

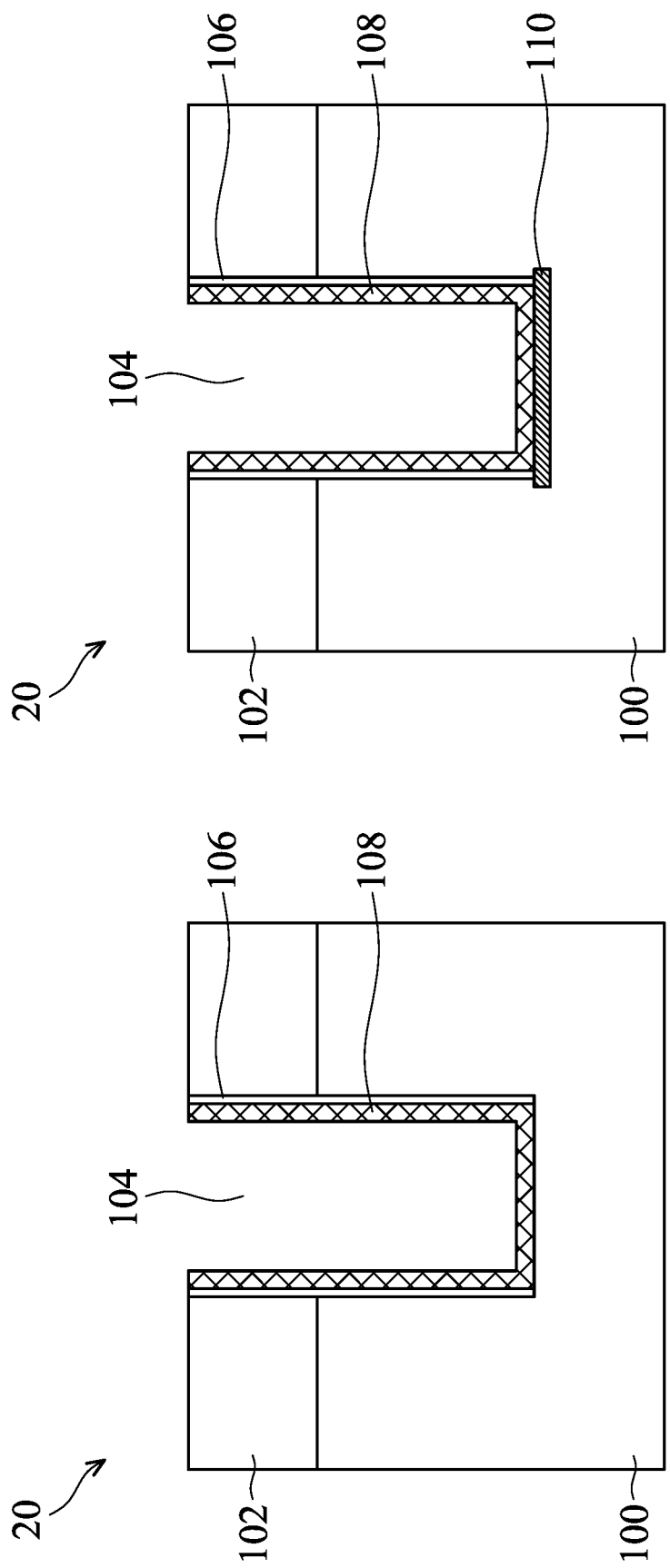

SEMICONDUCTOR DEVICE AND METHOD OF FORMING THE SAME

CROSS REFERENCE TO RELATED APPLICATIONS

This Application claims priority of Taiwan Patent Application No. 110127370 filed on Jul. 26, 2021, the entirety of which are incorporated by reference herein.

BACKGROUND

Technical Field

The present disclosure relates to a semiconductor device, and in particular to a semiconductor device with a partial metal channel region and method of forming the same.

Description of the Related Art

Dynamic random access memory (DRAM) is formed of a plurality of memory cells, each of which is generally formed by a transistor and a capacitor, and the memory cells are usually electrically connected to each other by word lines and bit lines. In order to improve the performance and integration of DRAM, DRAM with buried word lines have been developed to achieve electronic products that are lighter, thinner, shorter, smaller and have better performance.

However, continually increasing the integration of semiconductor devices may make it difficult to improve the performance of DRAM, or make its performance difficult to maintain, or even degrade.

Currents (e.g., on current ($I_{ON}$) or drive current) in the semiconductor device may decrease with the scaling down of the semiconductor device. For example, in order to overcome the leakage caused by the scaling down of the semiconductor device, the threshold voltage may be increased as much as the process margins and device design allow. However, increasing the threshold voltage may reduce the on current or drive current of the semiconductor device, thereby affecting the performance of the semiconductor device. For DRAM, lower drive current may adversely affect write recovery time (tWR) and/or retention time, resulting in the degradation of the performance of DRAM.

BRIEF SUMMARY

The present disclosure provides a semiconductor device, including a substrate, a pair of source/drain regions, a metal-containing layer, a gate structure, a gate dielectric layer, a buffer layer, and a gate conductive layer. The substrate has a trench therein. The pair of source/drain regions disposed in the substrate at opposite sides of the trench. The metal-containing layer disposed below the trench, wherein the metal-containing layer includes a metal silicide layer, the metal-containing layer and the substrate on opposite sidewalls of the trench collectively form the channel region of the semiconductor device. The gate structure disposed in the trench. The gate structure including the gate dielectric layer disposed on opposite sidewalls of the trench, the buffer layer disposed on the metal-containing layer, and the gate conductive layer disposed on the buffer layer and filling into the trench.

The present disclosure provides a method for forming a semiconductor device, including forming a doped region on a substrate; etching the substrate to form a trench through the doped region and extending into the substrate; forming a gate dielectric layer on sidewalls of the trench; forming a metal-containing layer below the trench, wherein the metal-containing layer comprises a metal silicide layer; forming a buffer layer on the metal-containing layer; and forming a gate conductive layer on the buffer layer and filling into the trench.

BRIEF DESCRIPTION OF THE DRAWINGS

FIGS. 4, 5, 6, 7, 8, 9, 10, 11, 12, and 13 illustrate cross-sectional views of processes for forming a semiconductor device according to some embodiments of the present disclosure.

FIGS. 14 and 15 illustrate cross-sectional views of processes for forming a semiconductor device according to other embodiments of the present disclosure.

DETAILED DESCRIPTION

The present disclosure provides semiconductor devices and methods for forming the same, wherein by using a metal-containing layer as a portion of the channel region of the semiconductor device, the drive current may be increased to improve the performance of the semiconductor device.

Figures 1A, 1B:
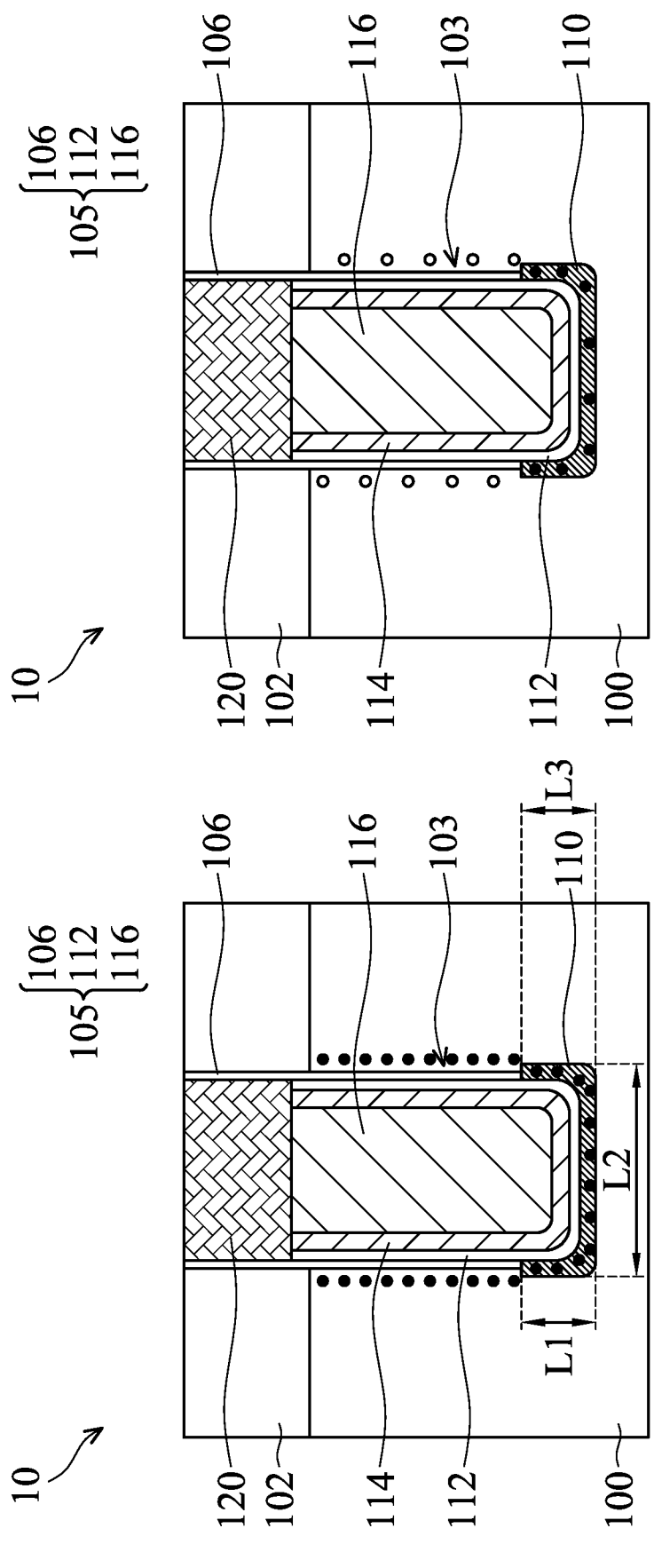
FIGS. 1A, 1B, and 2 illustrate cross-sectional views of a semiconductor device according to some embodiments of the present disclosure.

FIG. 1A illustrates a cross-sectional view of a semiconductor device 10 including a buried gate transistor. The semiconductor device 10 includes a substrate 100, a pair of source/drain regions 102, a metal-containing layer 110, and a gate structure 105. As shown in FIG. 1A, the substrate 100 has a trench 103 therein. The substrate 100 may include elemental semiconductors, compound semiconductors, alloy semiconductors, or a combination thereof. The substrate 100 may also be a semiconductor-on-insulator (SOI), or an undoped silicon substrate or a doped silicon substrate, wherein the doped silicon substrate may be an N-type silicon substrate or a P-type silicon substrate.

Referring to FIG. 1A, a pair of source/drain regions 102 are disposed in the substrate 100 at opposite sides of the trench 103. In some embodiments, the source/drain regions 102 may be N-type, e.g., doped with phosphorus, arsenic, or antimony, and the substrate 100 may be P-type, e.g., doped with boron or indium. In other embodiments, the source/drain regions 102 may be P-type and the substrate 100 may be N-type.

The metal-containing layer 110 is disposed below the trench 103 and surrounds the bottom of the trench 103. In some embodiments, the metal-containing layer 110 and the substrate 100 on opposite sidewalls of the trench 103 collectively form the channel region of the semiconductor device 10, and the substrate 100 on opposite sidewalls of the trench 103 is on the top of the metal-containing layer 110. In other words, the metal-containing layer 110 is a portion of the channel region of the semiconductor device 10. The metal-containing layer 110 may include a metal silicide layer, and the metal silicide layer may include a cobalt silicide layer ($CoSi_2$), a nickel silicide layer (NiSi), a titanium silicide layer (TiSi), other metal silicide layers, or a combination thereof. In some embodiments, the metal-containing layer 110 extends laterally beyond the sidewalls of the trench 103. In some embodiments, the thickness of the metal-containing layer 110 is greater than or equal to 5 nm. For example, the thickness of the metal-containing layer 110 may be in a range from about 5 nm to about 9 nm, such as about 5 nm, about 7 nm, about 8 nm, or about 9 nm.

As shown in FIG. 1A, a gate structure 105 is disposed in the trench 103. The gate structure 105 may be constructed by a gate dielectric layer 106, a buffer layer 112, and a gate conductive layer 116. The gate dielectric layer 106 is disposed on opposite sidewalls of the trench 103. In some embodiments, the bottom of the gate dielectric layer 106 is connected to the top of the metal-containing layer 110. The material of the gate dielectric layer 106 may include silicon oxide, silicon nitride, or silicon oxynitride. In some embodiments, the thickness of the gate dielectric layer 106 is less than the thickness of the metal-containing layer 110. For example, the thickness of the gate dielectric layer 106 may be in a range from about 4 nm to about 6 nm. In some embodiments, the metal-containing layer 110 laterally extends beyond the gate dielectric layer 106.

The buffer layer 112 is disposed on the metal-containing layer 110. In some embodiments, the buffer layer 112 is conformally disposed along the sidewalls of the gate dielectric layer 106 and along the upper surface of the metal-containing layer 110, forming the buffer layer 112 with a U-shaped profile. The materials of the buffer layer 112 may include silicon oxide, silicon nitride, silicon oxynitride, or high-k dielectric materials (dielectric constant greater than 3.9). For example, high k dielectric materials may include $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $Al_2O_3$, or a combination thereof. In some embodiments, the buffer layer 112 is a single layer structure formed of silicon oxide. In other embodiments, the buffer layer 112 is a multi-layer structure including silicon oxide and high k dielectric material.

A gate conductive layer 116 is disposed on the buffer layer 112 and filling into the trench 103. In some embodiments, the top surfaces of the buffer layer 112 and the gate conductive layer 116 are level with each other. The gate conductive layer 116 may include a metal layer, a metal nitride layer, or a combination thereof. The material of the metal layer may include aluminum, copper, tungsten, titanium, tantalum, metal alloys, other suitable materials, or a combination thereof. The material of the metal nitride layer may include titanium nitride (TiN), tantalum nitride (TaN), tungsten nitride (WN), other suitable materials, or a combination thereof. In some embodiments, the gate conductive layer 116 is a multi-layer structure including a metal nitride layer (e.g., titanium nitride) and a metal layer (e.g., tungsten) disposed on the top of the metal nitride layer. In other embodiments, the gate conductive layer 116 is a single layer structure formed by a single metal nitride layer. In some embodiments, the metal-containing layer 110 is U-shaped and surrounds a portion of the gate conductive layer 116, as shown in FIG. 1A. In some embodiments, a barrier layer 114 may be disposed between the buffer layer 112 and the gate-conducting layer 116. For example, the material of the barrier layer 114 may include SiN, SiCN, SiOC, or SiOCN.

Referring to FIG. 1A, in some embodiments, the semiconductor device 10 may include an isolation layer 120. An isolation layer 120 is disposed on the buffer layer 112 and the gate conductive layer 116, and between the source/drain regions 102. In some embodiments, the isolation layer 120 fills the top of the trench 103 and may be level with the surface of the substrate 100. The material of the isolation layer 120 may be the same as or similar to the material of the gate dielectric layer 106. For example, the isolation layer 120 may include silicon nitride.

According to some embodiments, the metal-containing layer 110 and the substrate 100 on opposite sidewalls of the trench 103 collectively form the channel region of the semiconductor device 10. The metal-containing layer 110 in the channel region may reduce the resistance of the channel region, thereby increasing the mobility of the electrons to increase the on current (or drive current) and thus improving the performance of the device. In the present disclosure, the metal-containing layer 110 is a part of the channel region of the semiconductor device 10, and the metal-containing layer 110 is separated from the source/drain regions 102 by the substrate 100, i.e., the metal-containing layer 110 does not directly contact the source/drain regions 102. Therefore, the metal-containing layer 110 does not cause a short to the source/drain regions 102.

As shown in FIG. 1A, the solid dots are drawn to schematically represent the electrons at the on state. At the on state, the electrons flow from one of the source/drain regions 102 to the other one of the source/drain regions 102 through the channel region (the metal-containing layer 110 and the substrate 100 on the opposing sidewalls of the trench 103). When the electrons pass through the channel region, the metal-containing layer 110 may enhance the electrons' mobility. As will be described below, the length of the metal-containing layer 110 may be adjusted by the process for forming the metal-containing layer 110. In some embodiments, referring to FIG. 1A, the length of the metal-containing layer 110 is the sum of the lengths L1 and L3 in the first direction DR1 and the length L2 in the second direction DR2 (i.e., the length of the metal-containing layer 110 is L1+L2+L3). In some embodiments, the first direction DR1 is perpendicular to the second direction DR2. According to some embodiments, the length L1 and the length L3 may each be in a range from about 5 nm to about 10 nm. According to some embodiments, the length L2 may be in a range from about 20 nm to about 30 nm.

Referring to FIG. 1B, the electrons (solid dots) and electron holes (hollow circles) at the off state are schematically drawn, and the free electrons (if existed) in the metal-containing layer 110 at the off state may recombine with the electron holes at the off state. Therefore, using the metal-containing layer as a portion of the channel region in a semiconductor device will not result in leakage or short.

Figures 2, 3:
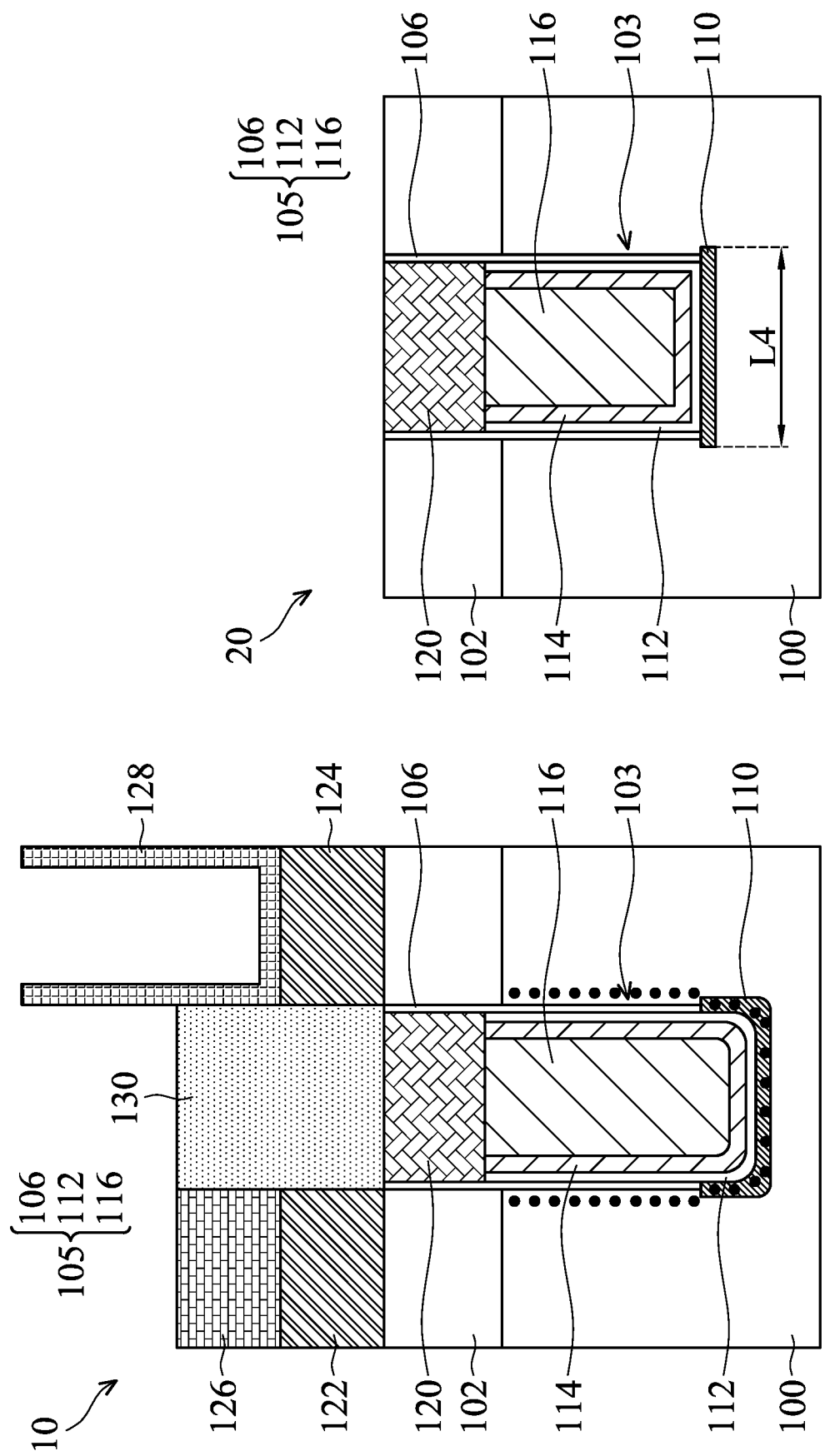
FIG. 3 illustrates a cross-sectional view of a semiconductor device according to other embodiments of the present disclosure.

Referring to FIG. 2, according to some embodiments, the semiconductor device 10 may belong to a DRAM application, wherein the gate structure 105 of the semiconductor device 10 functions as an buried word line of DRAM, and DRAM further includes a first connecting feature 122, a second connecting feature 124, an isolation structure 130, a bit line 126, and a capacitor 128. It should be noted that, for the sake of clarity, the features may not be drawn to actual scale. The first connecting feature 122 and the second connecting feature 124 are disposed on the source/drain regions 102, respectively. The materials of the first connecting feature 122 and the second connecting feature 124 may include aluminum, copper, tungsten, other suitable materials, or a combination thereof. The isolation structure 130 is disposed between the first connecting feature 122 and the second connecting feature 124. The material of the isolation structure 130 may include silicon oxide, silicon nitride, or silicon oxynitride. The bit line 126 is disposed on the first connecting feature 122. In some embodiments, the formation of the bit line 126 may be the same as or similar to the gate structure 105 functioning as the buried word line. The capacitor 128 is disposed on the second connecting feature 124. In some embodiments, the capacitor 128 is electrically connected to one of the source/drain regions 102 by the second connecting feature 124, and the bit line 126 is electrically connected to the other one of the source/drain regions 102 by the first connecting feature 122. In some embodiments, the metal-containing layer 110 is U-shaped and surrounds the bottom of the gate structure 105 functioning as the buried word line.

As discussed above, a lower drive current may adversely affect the write recovery time (tWR) and/or the retention time, thereby degrading the performance of DRAM. For example, at the on state, the lower drive current requires a longer write time to fill the capacitor with the desired amount of charge, and the longer write recovery time (i.e., slower write speeds) results in degrading the performance of DRAM. On the other hand, a lower drive current provides less amount of charge in the same write time, so at the off state, less amount of charge remains in the capacitor, and resulting in a shorter retention time and degrading the performance of DRAM.

In the embodiments shown in FIG. 2, the metal-containing layer 110 and the substrate 100 on opposite sidewalls of the trench 103 collectively form the channel region of DRAM. The metal-containing layer 110 increases the mobility of the electrons to improve the drive current. As a result, the write recovery time may be reduced to improve the performance of DRAM. In addition, in some embodiments, due to the increased drive current, a larger amount of charge may be charged in the capacitor for the same write time, and the retention time may be increased to improve the performance of DRAM.

The metal-containing layer 110 may have other shapes or different lengths. Referring to FIG. 3, the metal-containing layer 110 of the semiconductor device 20 may have a length L4 in a range from about 20 nm to about 30 nm. The metal-containing layer 110 of the semiconductor device 20 is disposed only below the trench 103 and does not extend upward to the sidewalls of the trench 103, and thus the length L4 may be smaller than the length (L1+L2+L3) of the metal-containing layer 110 of the semiconductor device 10 in FIG. 1A described above. In these embodiments, the shorter metal-containing layer 110 may further provide process and device design flexibility, and may simplify the process and reduce process costs. In some embodiments, the metal-containing layer 110 of the semiconductor device 20 laterally extends beyond the sidewalls of the trench 103 and/or the sidewalls of the gate dielectric layer 106.

Figure 4:
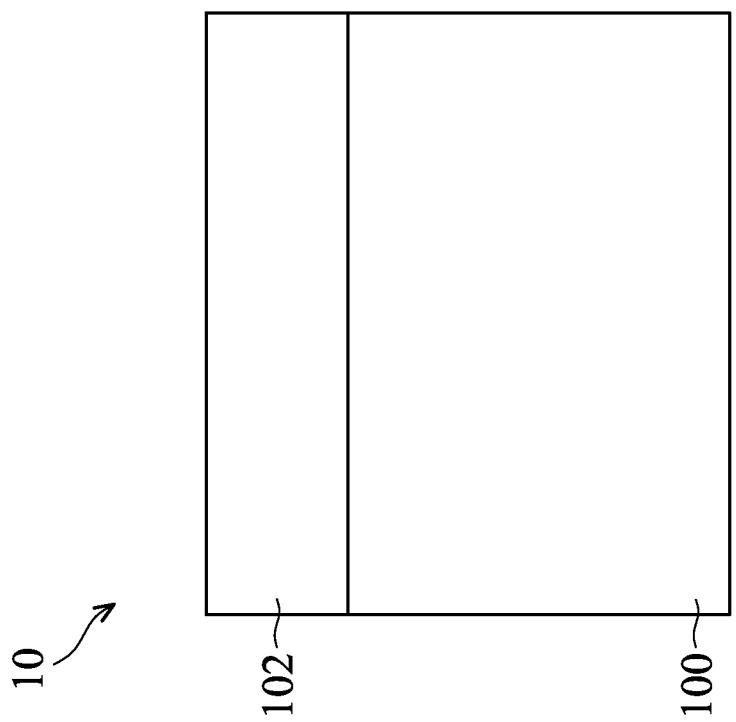
Figure 7:
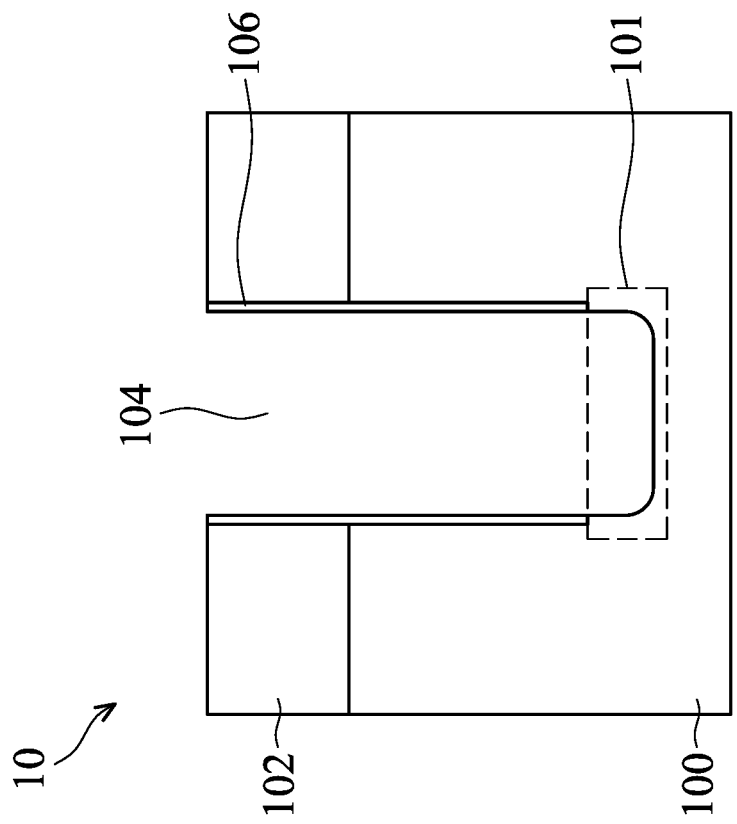

FIGS. 4, 5, 6, 7, 8, 9, 10, 11, 12, and 13 illustrate cross-sectional views of processes for forming a semiconductor device 10 according to some embodiments of the present disclosure. As shown in FIG. 4, a substrate 100 is blanketly doped to form a doped region 102 on the substrate 100. The doping may be performed by using ion implantation, and the dopant is implanted to the substrate 100. The dopant may include an N-type dopant, such as phosphorus, arsenic, antimony, or other N-type dopants. In other embodiments, the dopant may include a P-type dopant, such as boron, indium, or other P-type dopants.

Figure 5:
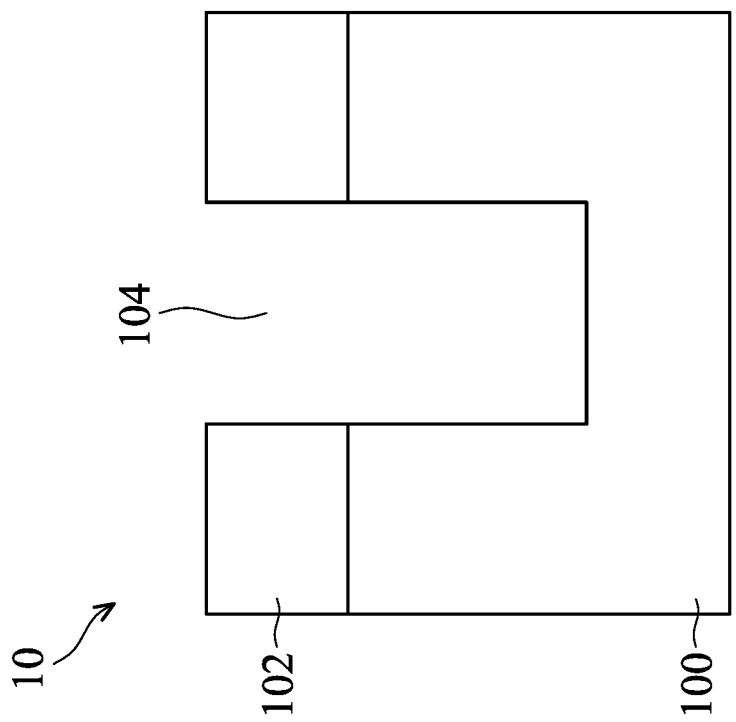

As shown in FIG. 5, a patterning process is performed to form a first trench 104 through the doped region 102 and extending into the substrate 100. The patterning process may include forming a photoresist layer (not shown) on the doped region 102, exposing the photoresist layer to a pattern, performing a post-exposure baking process to develop the photoresist layer described above to form a patterned mask layer, then etching the doped region 102 and the substrate 100 with the patterned mask layer to form the first trench 104, and then removing the patterned mask layer. The etching process may include dry etching process (e.g., reactive ion etching (RIE) or plasma etching), wet etching process, and/or other suitable processes. After the patterning process, the doped region 102 on opposite sides of the first trench 104 may function as the source/drain regions for the subsequently formed semiconductor device.

Figure 6:
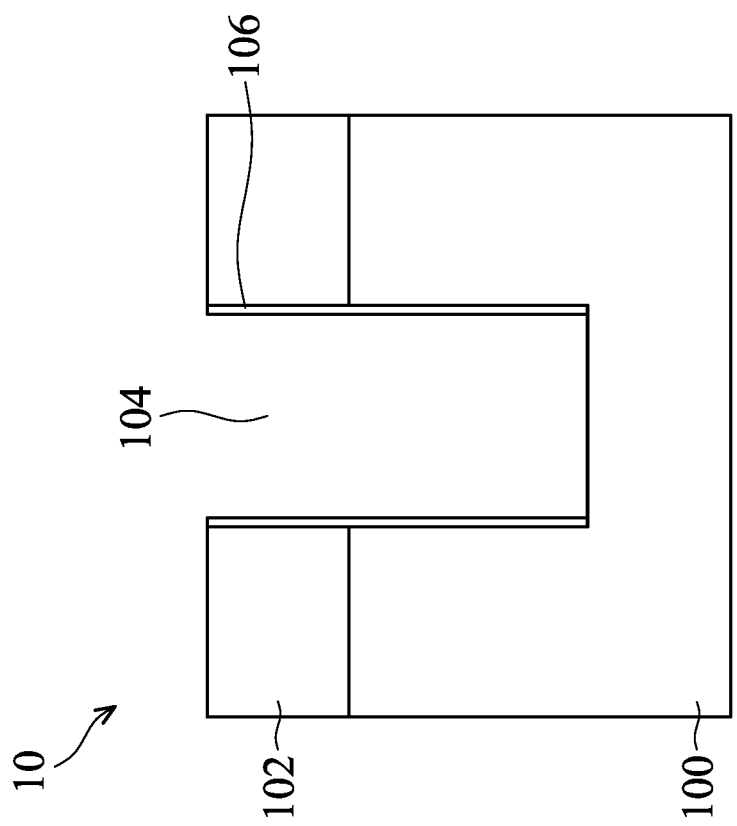
Figure 9:
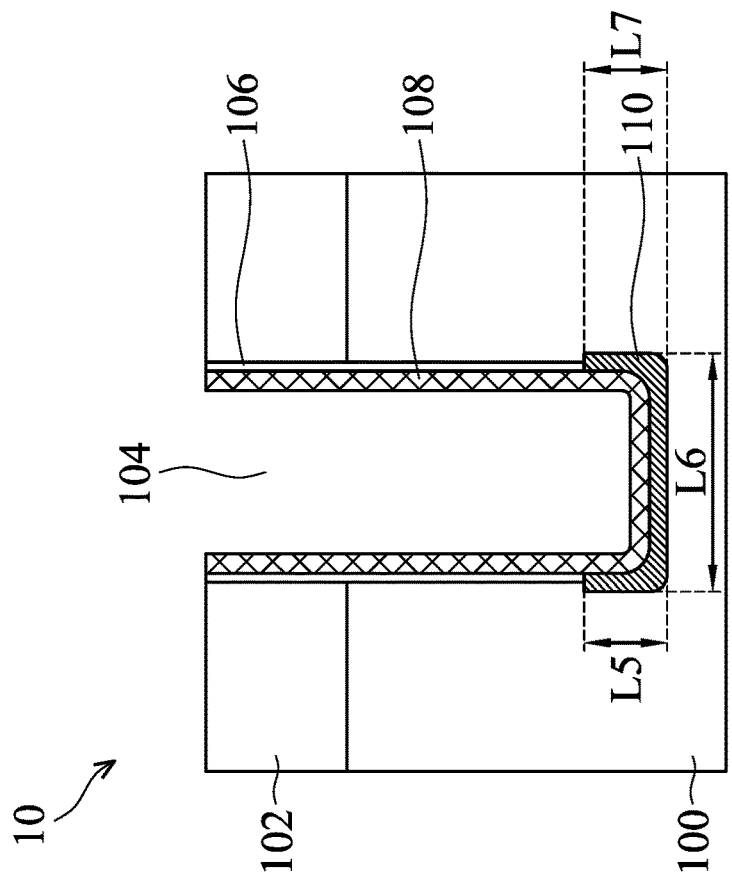

Referring to FIG. 6, a gate dielectric layer 106 is formed on the sidewalls of the first trench 104. The material of the gate dielectric layer 106 may include silicon oxide, silicon nitride, silicon oxynitride, or other dielectric materials, and may be formed by any suitable method, such as chemical vapor deposition (CVD), plasma-assisted chemical vapor deposition, in-situ steam generation (ISSG), or the like. According to some embodiments, the gate dielectric layer 106 is formed by in-situ steam generation (ISSG) to form a silicon oxide layer on the sidewalls of the first trench 104 and on the substrate 100, followed by removing the undesired silicon oxide layer (e.g., the silicon oxide layer on the doped region 102 or on the substrate 100) by a suitable etching process, thereby forming the gate dielectric layer 106 on the sidewalls of the first trench 104.

FIGS. 7-10 illustrate the process for forming the metal-containing layer 110 below the first trench 104. Although some embodiments in the present disclosure are described in a sequence of these figures, the steps in these embodiments may also be performed in other logical sequences, or the steps in some embodiments may be omitted. First, referring to FIG. 7, the substrate 100 is etched along the first trench 104, and the first trench 104 is further extended downward, thereby forming an extension region 101 as shown in the dashed block of FIG. 7. The process of extending the first trench 104 may be the same as or similar to the patterning process described above with respect to FIG. 5.

Figure 8:
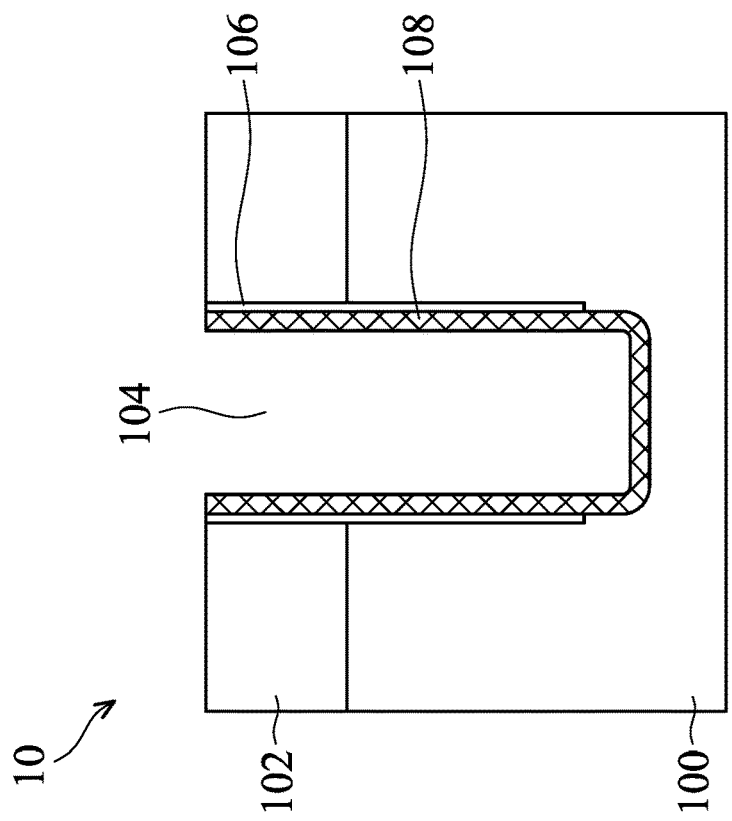

Referring to FIG. 8, the metal layer 108 is formed on the sidewalls of the gate dielectric layer 106 and on the bottom and sidewalls of the extended first trench 104. The material of the metal layer 108 may include cobalt, nickel, titanium, or other metals, and may be formed by physical vapor deposition (PVD) (e.g., sputter), atomic layer deposition (ALD), or other processes. Next, referring to FIG. 9, a thermal treatment process is performed to react the metal layer 108 with the substrate 100 below the first trench 104 and the gate dielectric layer 106 to form a metal-containing layer 110 (also referred to as a metal silicide layer 110 after the silicidation process). The thermal treatment process may include an annealing process, e.g., rapid thermal annealing (RTA). In some embodiments, the thickness of the metal silicide layer 110 may depend on the manner in which the annealing process is performed (e.g., one-step or two-step annealing) and/or the parameters (e.g., annealing temperature). In some embodiments, the annealing temperature will be selected according to the material of the selected metal layer 108. For example, the thickness of the metal silicide layer 110 may be adjusted so that it laterally extends beyond the sidewalls of the gate dielectric layer 106. In some embodiments, the material formation of the metal silicide layer 110 depends on the material of the metal layer 108. The metal silicide layer 110 includes a cobalt silicide layer ($CoSi_2$), a nickel silicide layer (NiSi), a titanium silicide layer (TiSi), or a combination thereof. In some embodiments, referring to FIGS. 7 and 9, the metal-containing layer 110 is formed below and around the extension region 101, so that the extension depth of the first trench 104 may be adjusted by the process of extending the first trench 104 to control the length L6 of the metal-containing layer 110 along the bottom of the extended first trench 104 and/or the lengths L5 and L7 along the sidewalls of the extended first trench 104. According to some embodiments, the lengths L5 and L7 may each be in a range from about 5 nm to about 10 nm. According to some embodiments, the length L6 may be in a range from about 20 nm to about 30 nm. As described above, the metal layer 110 may be a portion of the channel region of the semiconductor device 10 to increase the drive current. Thus, the length of the metal-containing layer 110 may be adjusted by the process described above to achieve the desired drive current according to the design requirements of the device. Next, the unreacted metal layer 108 is removed, as shown in FIG. 10. The unreacted metal layer 108 may be removed by etching process. Although the description above relates to the formation of the metal-containing layer 110 by a metal silicidation process, the present disclosure is not limited thereto. For example, in other embodiments, the metal-containing layer 110 may be formed in other manner, such as physical vapor deposition (PVD), metal-organic chemical vapor deposition (MOCVD), or other suitable processes.

Referring to FIG. 11, the buffer layer 112 is conformally formed on the metal-containing layer 110. In some embodiments, the buffer layer 112 is also formed on the sidewalls of the gate dielectric layer 106. The material of buffer layer 112 may include silicon oxide, silicon nitride, silicon oxynitride, or a high k dielectric material. The buffer layer 112 may be formed by chemical vapor deposition (CVD), atomic layer deposition (ALD), plasma-assisted chemical vapor deposition, physical vapor deposition (PVD), spin-on coating, one or more other suitable processes, or a combination thereof. The buffer layer 112 may be a single-layer structure or a multi-layer structure formed by different materials.

Figure 12:
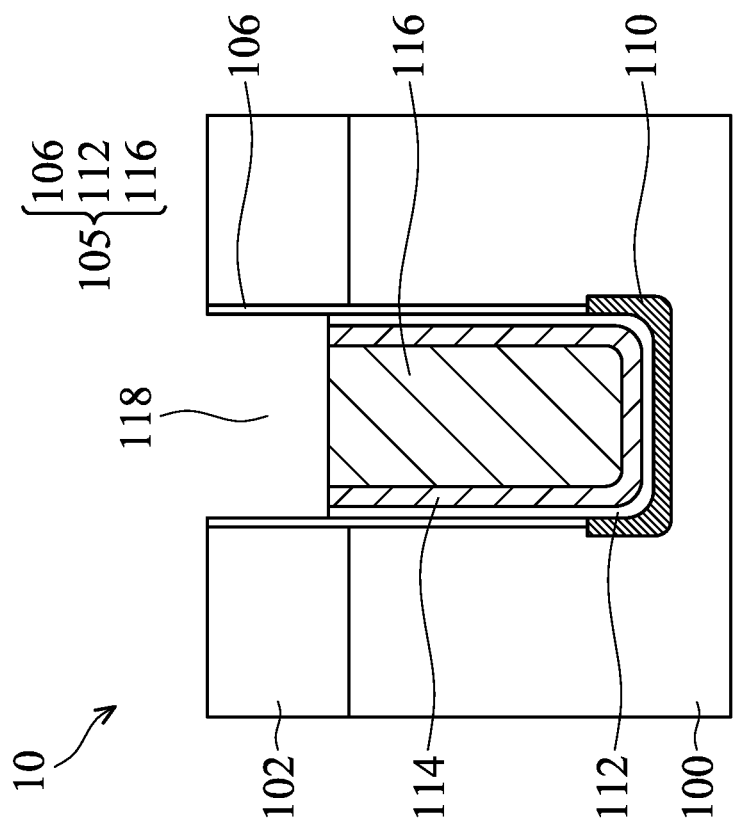

Referring to FIG. 12, the gate conductive layer 116 is formed on the buffer layer 112 and filling into the first trench 104. The gate conductive layer 116 may include a metal layer, a metal nitride layer, or a combination thereof. The gate conductive layer 116 may be formed by physical vapor deposition (PVD), atomic layer deposition (ALD), chemical vapor deposition (CVD), plasma-assisted chemical vapor deposition, other suitable processes, or a combination thereof. In some embodiments, the gate conductive layer 116 may be a multi-layer structure including a metal nitride layer formed on the sidewalls and bottom surface of the buffer layer 112 and a metal layer formed on the metal nitride layer and filling into the first trench 104. In these embodiments, the metal nitride layer may function as a barrier. In other embodiments, for example, in semiconductor devices with smaller trench widths for further scaling, a single layer of gate conductive layer 116, such as a single layer of metal nitride, may be used due to its smaller trench widths.

In some embodiments, an optional barrier layer 114 is formed along the sidewalls and/or bottom surface of the buffer layer 112 before forming the gate conductive layer 116 on the buffer layer 112. The material of the barrier layer 114 may include SiN, SiCN, SiOC, or SiOCN, and may be formed by chemical vapor deposition (CVD) or plasma-assisted chemical vapor deposition.

Figure 13:
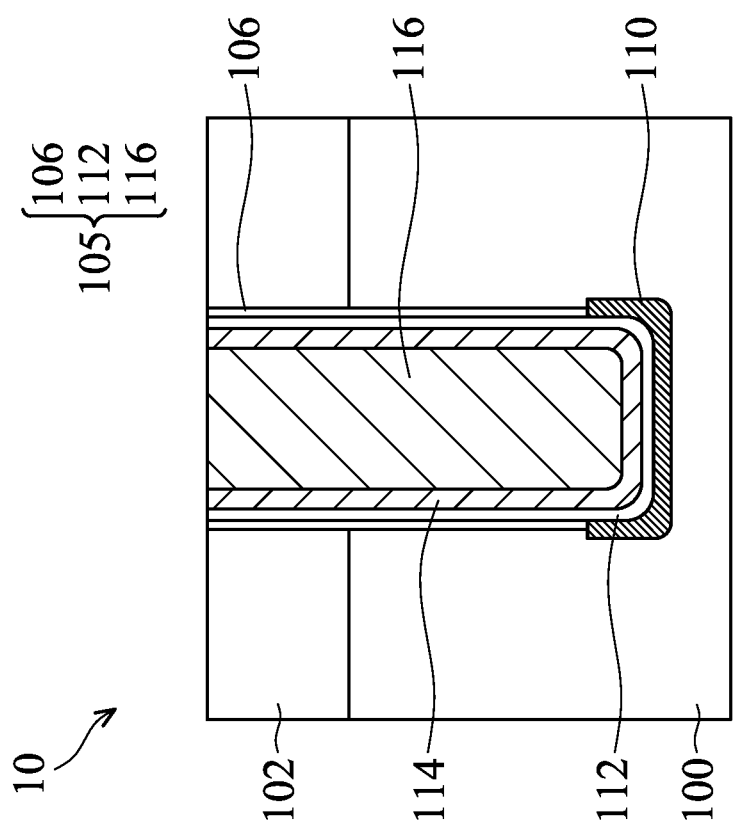

Referring to FIG. 13, the buffer layer 112, the barrier layer 114 (if formed), and the gate conductive layer 116 are recessed to form a second trench 118 exposing the gate dielectric layer 106. In some embodiments, the recessing is performed by an etching back process, which may include a dry etching process (e.g., reactive ion etching) or other etching processes. In some embodiments, the top surfaces of the buffer layer 112, the barrier layer 114 (if formed), and the gate conductive layer 116 are level with each other after the etching. Next, an isolation layer 120 is filled into the second trench 118 to form the semiconductor device 10 as shown in FIG. 1A. In some embodiments, the isolation material layer may be deposited into the second trench 118 by chemical vapor deposition (CVD) or plasma-assisted chemical vapor deposition, and then a planarization process (e.g., chemical mechanical polish (CMP) or etching-back process) is performed to remove the excess isolation material layer, thereby forming the isolation layer 120.

According to some embodiments of the present disclosure, after forming the semiconductor device 10 shown in FIG. 1A, subsequent processes may be performed to form DRAM shown in FIG. 2. The subsequent processes include (but are not limited to) forming the first connecting feature 122 and the second connecting feature 124 on the source/drain regions 102, forming the isolation structure 130 between the first connecting feature 122 and the second connecting feature 124, forming the bit line 126 on the first connecting feature 122, and forming the capacitor 128 on the second connecting feature 124.

FIGS. 14 and 15 illustrate cross-sectional views of processes for forming a semiconductor device 20 according to other embodiments of the present disclosure. After forming the first trench 104 shown in FIG. 6, the process of extending the trench shown in FIG. 7 may be omitted, and the metal layer 108 is formed on the sidewalls of the gate dielectric layer 106 and the bottom of the first trench 104, as shown in FIG. 14. Then, a thermal treatment process is performed to react the metal layer 108 with the substrate 100 below the first trench 104 and the gate dielectric layer 106 to form a metal silicide layer 110, as shown in FIG. 15. Next, processes similar to those described above with respect to FIGS. 10-13 and the process of filling the isolation layer 120 are performed to form the semiconductor device 20 shown in FIG. 3. In these embodiments, as described above, the drive current may be increased to improve the performance of device, and process cost and time may be reduced by omitting the process of extending the trench.

The present disclosure provides semiconductor devices and methods for forming the same, including forming a metal-containing layer as a portion of the channel region of the semiconductor device, which may increase the drive current to improve the performance of the semiconductor device. For example, the write recovery time (tWR) may be reduced. In some embodiments, the retention time may also be increased. In addition, the method for forming a semiconductor device provided in the present disclosure allows the length of the metal-containing layer to be adjusted to achieve the desired drive current and increase the process margin based on the requirements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate having a trench therein;

a pair of source/drain regions disposed in the substrate at opposite sides of the trench;

a metal-containing layer disposed below the trench, wherein the metal-containing layer comprises a metal silicide layer, the metal-containing layer and the substrate on opposite sidewalls of the trench collectively form a channel region of the semiconductor device; and a gate structure disposed in the trench, the gate structure comprising:

a gate dielectric layer disposed on opposite sidewalls of the trench;

a buffer layer disposed on the metal-containing layer; and a gate conductive layer disposed on the buffer layer and filling into the trench.

2. The semiconductor device as claimed in claim 1, wherein the metal-containing layer laterally extends beyond the opposite sidewalls of the trench.

3. The semiconductor device as claimed in claim 1, wherein the metal-containing layer is U-shaped and surrounds a portion of the gate conductive layer.

4. The semiconductor device as claimed in claim 1, wherein the metal silicide layer comprises: a cobalt silicide layer ($CoSi_2$), a nickel silicide layer (NiSi), a titanium silicide layer (TiSi), or a combination thereof.

5. The semiconductor device as claimed in claim 1, further comprising:

a first connecting feature and a second connecting feature respectively disposed on the pair of source/drain regions;

an isolation structure disposed between the first connecting feature and the second connecting feature;

a bit line disposed on the first connecting feature; and a capacitor disposed on the second connecting feature.

6. The semiconductor device as claimed in claim 1, further comprising:

an isolation layer disposed on the buffer layer and the gate conductive layer and between the pair of source/drain regions.

7. The semiconductor device as claimed in claim 1, wherein a thickness of the gate dielectric layer is smaller than a thickness of the metal-containing layer.

8. The semiconductor device as claimed in claim 1, further comprising:

a barrier layer disposed between the buffer layer and the gate conductive layer.

9. The semiconductor device as claimed in claim 3, wherein a length of a vertical portion of the metal-containing layer is in a range from 5 nm to 10 nm.

10. The semiconductor device as claimed in claim 3, wherein a length of a horizontal portion of the metal-containing layer is in a range from 20 nm to 30 nm.

11. The semiconductor device as claimed in claim 1, wherein the substrate separates the metal-containing layer from the pair of source/drain regions.

* * * * *